United States Patent [19]

Matsushita et al.

[11] Patent Number: 4,676,630
[45] Date of Patent: Jun. 30, 1987

[54] EXPOSURE APPARATUS

[75] Inventors: Koichi Matsushita, Chiba; Junji Isohata, Tokyo; Hironori Yamamoto, Chigasaki; Makoto Miyazaki, Yokohama; Kunitaka Ozawa, Isehara; Hideki Yoshinari, Yokohama, all of Japan

[73] Assignee: Canon Kabushiki Kaisha, Tokyo, Japan

[21] Appl. No.: 854,541

[22] Filed: Apr. 22, 1986

[30] Foreign Application Priority Data

Apr. 25, 1985 [JP] Japan .................................. 60-87552
Apr. 30, 1985 [JP] Japan .................................. 60-90893
Apr. 30, 1985 [JP] Japan .................................. 60-90895

[51] Int. Cl.$^4$ .......................................... G03B 27/42
[52] U.S. Cl. ...................................................... 355/53
[58] Field of Search .......................................... 355/53

[56] References Cited

U.S. PATENT DOCUMENTS 4,362,385 12/1982 Lobach .................................. 355/53
4,370,054  1/1983 Isohata et al. ........................ 355/53
4,425,037  1/1984 Hershel et al. ....................... 355/53

Primary Examiner—Monroe H. Hayes
Attorney, Agent, or Firm—Fitzpatrick, Cella, Harper & Scinto

[57] ABSTRACT

An exposure apparatus for exposing a plate-like member to a pattern with radiation in a step-and-repeat manner thereby to transfer images of the pattern onto different regions on a surface of the plate-like member. The apparatus includes an X-Y stage for moving the plate-like member in X and Y directions, a $\theta$-stage for moving the plate-like member in a $\theta$ (rotational) direction relative to the X-Y stage, and laser interferometers for measuring an amount of movement of the plate-like member, by the X-Y stage, in each of the X and Y directions by use of a mirror mounted on the $\theta$-stage. Placement of the mirror on the $\theta$-stage allows correction of yawing if it occurs during movement of the plate-like member by X-Y stage. Also, deviation of the plate-like member in the Y direction if it occurs during movement of the plate-like member by the X-Y stage in the X direction, is detected by the laser interferometers. This allows detection of a positional error of the mirror in the $\theta$ direction and allows correction of the $\theta$-error by the $\theta$-stage.

10 Claims, 7 Drawing Figures

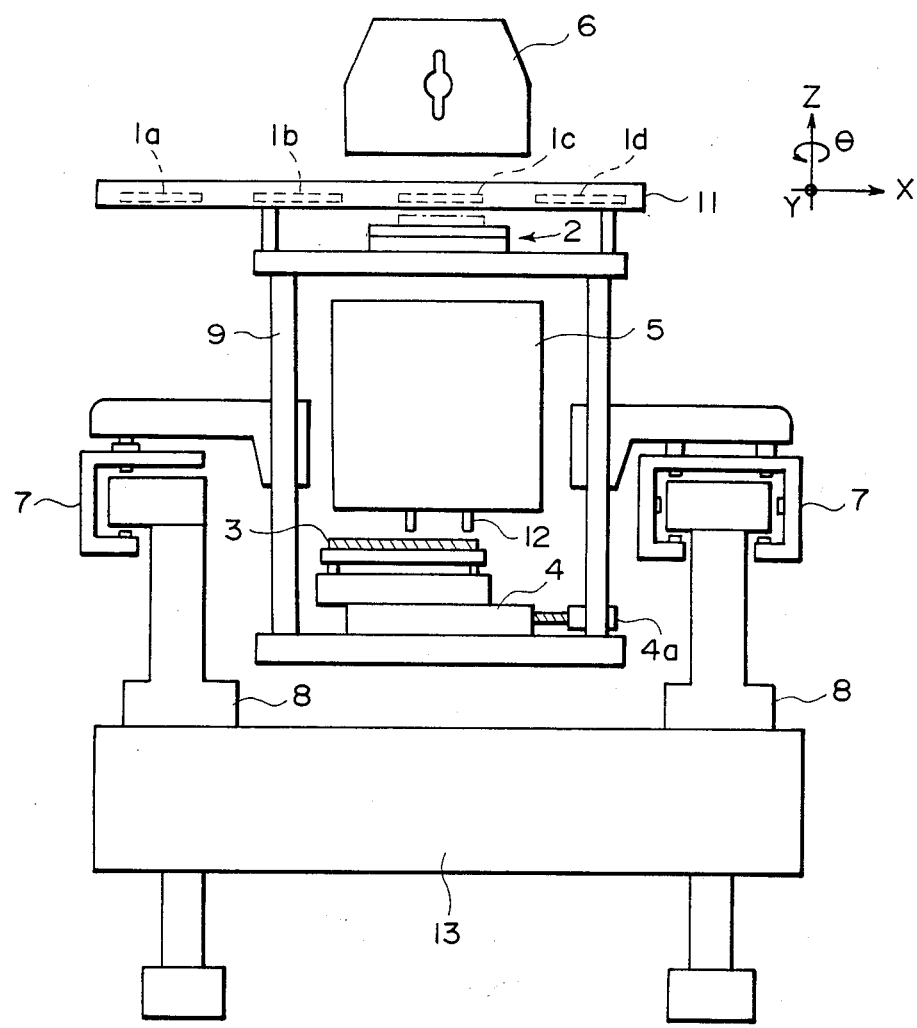
F I G. 1

FIG. 3

EXPOSURE APPARATUS

FIELD OF THE INVENTION AND RELATED ART

This invention relates to an exposure apparatus for exposing a plate-like member to a pattern with radiation in a step-and-repeat manner, thereby to transfer images of the pattern onto different regions on the plate-like member.

Exposure apparatuses of the type described above are well known in the field of manufacture of semiconductor devices such as integrated circuits. And, there have already been developed various types of exposure apparatuses, such as contact exposure type, proximity exposure type, mirror projection exposure type, lens projection exposure type, etc. Also, in this field, it is known that a laser interferometer is used to detect the amount of movement of an X-Y stage, carrying thereon a plate-like member such as a semiconductor wafer, at the time of exposure of the plate-like member in a step-and-repeat manner.

If, during the movement of the plate-like member by the X-Y stage, any yawing of the X-Y stage (rotational displacement in a plane containing the X and Y axes) occurs, a $\theta$-error (rotational error) is caused between the plate-like member and a photomask having a pattern. Where such $\theta$ error is caused at the time of pattern transfer using a first mask (which is a mask having a pattern to be transferred onto a first layer on the plate-like member), there would occur partial overlapping, irregular gaps, shift or dislocation, or the like between the patterns sequentially transferred onto the surface of the plate-like member. This is because no alignment mark has not yet been formed on the plate-like member so that alignment of the plate-like member with respect to the first mask is not attainable. When, on the other hand, the yawing occurs at the time of pattern transfer using a second mask, a third mask or the like with respect to which the alignment of the plate-like member is attainable by use of alignment marks having been transferred onto the plate-like member, an additional time is required to correct the $\theta$-error after completion of the movement of the plate-like member by the X-Y stage. This degrades the throughput of the apparatus. In conventional exposure apparatuses, attempts have been made to improve stiffness of guide members or the like for the X-Y stage and to improve machining precision for such members, so as to prevent occurrence of yawing. However, occurrence of yawing can not be sufficiently prevented by these attempts. Also, the laser interferometer for detecting the amount of movement has its mirror mounted on the X-Y stage. This is not advantageous, as will be understood from the following description of the invention.

SUMMARY OF THE INVENTION

It is accordingly a primary object of the present invention to provide an exposure apparatus by which accurate pattern transfer relative to a plate-like member is attainable even if there occurs yawing of the plate-like member at the time of step-and-repeat pattern transfer for transferring a pattern onto each of different areas on the surface of the plate-like member.

Briefly, according to the present invention, there is provided an apparatus for exposing a plate-like member to a pattern with radiation in a step-and-repeat manner so as to transfer images of the pattern onto different regions on a surface of the plate-like member, said apparatus comprising: means for exposing the plate-like member to the pattern with radiation; means for moving the plate-like member relative to said exposing means in a step-and-repeat manner, said moving means having a rectilinear guide stage for guiding the plate-like member in a rectilinear direction and a rotational guide stage for guiding the plate-like member in a rotational direction relative to said rectilinear guide stage; and means for measuring an amount of movement of said rectilinear guide stage by use of optical interference, said measuring means having a measuring-point determining member disposed so as to be movable as a unit with said rotational guide stage.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 1 is a schematic view of an exposure apparatus according to one embodiment of the present invention.

FIG. 3 is an enlarged sectional view of a stage for carrying a plate-like member, according to the embodiment of FIG. 1.

DESCRIPTION OF THE PREFERRED EMBODIMENTS

Figure 2:
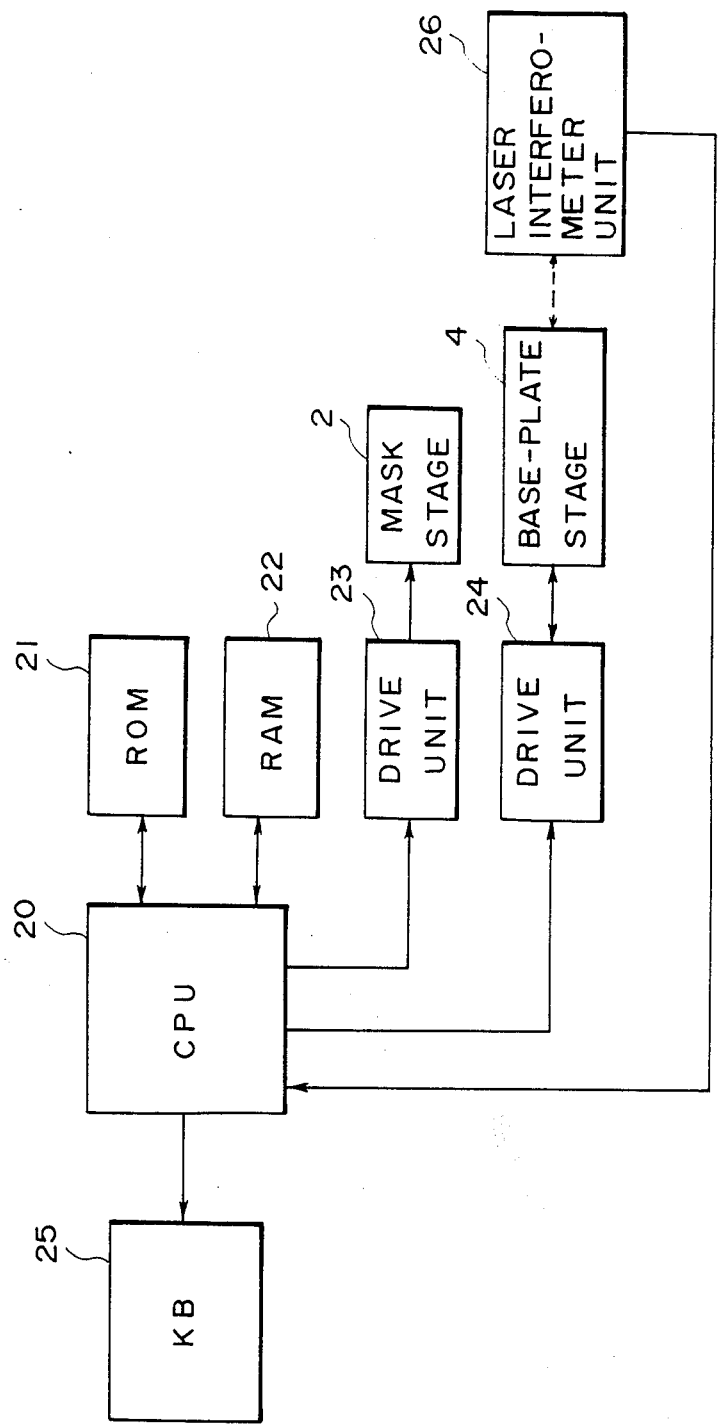
FIG. 2 is a block diagram showing a control system of the exposure apparatus of the FIG. 1 embodiment.

Description will now be made of an embodiment of the present invention, taken in conjunction with the drawings attached to this Specification. In this embodiment, the invention is applied to an exposure apparatus of the mirror projection type usable for exposing, to a pattern with radiation, a plate-like member which constitutes a portion of a large-size flat-panel liquid crystal display device.

As shown in FIG. 1, the exposure apparatus is usable with four photomasks 1 (1a, 1b, 1c and 1d) each having a fine pattern formed on its lower surface. The exposure apparatus includes a mask stage 2 for carrying thereon one of the masks 1a–1d at a time. The mask stage 2 is movable in each of X, Y and $\theta$ (rotational) directions for fine adjustment of the position of the mask carried by the mask stage. Denoted in this Figure by numeral 3 is a glass substrate or base plate of rectangular square shape having a diagonal length of an order of fourteen (14) inches. For the manufacture of a liquid crystal panel display device, for example, a number of displaying picture elements as well as switching transistors for controlling actuation and de-actuation of the picture elements, capacitors, connecting terminals and so on are to be formed on the surface of the glass base plate 3 by ordinary photolithographic processes. The glass base plate 3 is held by a base-plate carrying stage 4 which is movable in each of the X, Y and θ (rotational) directions. Also, the stage 4 is arranged to be moved stepwise in each of the X and Y directions, for the sake of plural-shot exposure of the glass base plate 3 as will be described later. Such step-feeding of the stage 4 is controlled by a fine movement-measuring system using a laser interferometer, not shown. The exposure apparatus further includes a mirror projection optical system 5 of known type, comprising a combination of concave and convex mirrors. The mirror projection system is adapted to project, onto the glass base plate 3 at a unit magnification, an image of the pattern of one of the masks 1a–1d which is held at a predetermined position (exposure station) by the mask stage 2. An illumination optical system 6 includes a light source (not shown) for providing light of a predetermined wavelength or wavelength range to to light passed through the pattern of the mask held by the mask stage 2, the fine pattern of such mask is photolithographically transferred onto the glass base plate 3. The mirror projection system 5 is disposed such that its optical axis is accurately aligned with the optical axis of the illumination optical system 6.

Denoted by numerals 7 and 7 are linear air-bearing assemblies (hereinafter simply "LAB") which are movable along two guide rails 8 and 8, respectively, extending in the Y direction. One of these bearing assemblies (LAB) is of the type in which it is constrained with respect to movement in the X direction (positive and negative) and in a Z direction (positive and negative). The other of the bearing assemblies is of the type in which it is constrained with respect to movement in the Z direction. A carriage 9 is provided to hold the mask stage 2 and the base-plate stage 4 in a predetermined relation, and is supported by the LAB 7. With this arrangement, the mask 1 carried by the mask stage 2 and the glass base plate 3 carried by the base-plate stage 4 can be scanningly moved as a unit in the Y direction relative to the projection system 5, during the exposure of the mask and the base plate to the light emitted from the illumination optical system 6.

The exposure apparatus further includes a mask feeder 11 for sequentially feeding the masks 1a–1d to the exposure station on the mask stage 2. That is, the mask feeder 11 is arranged to change masks each time the scanning exposure of one of different areas on the glass base plate 3 is completed. Gap sensors denoted by numeral 12 are provided to detect the distance between the surface of the base plate 3 and the focal plane of the projection optical system 5. For example, air-microsensors utilizing air pressure or photoelectric sensors utilizing reflection light from the base plate 3 are usable as the gap sensors. The projection optical system 5, the illumination optical system 6 and the guide rails 8 are supported by a base or surface plate 13 in a predetermined interrelation.

In the exposure apparatus of FIG. 1, as understood, the surface of the base plate 3 is divided into, e.g., four different imaginary areas and these areas are sequentially placed at the exposure station under the projection optical system 5 with the aid of the step-feeding by the stage 4. Thus, four exposures are effected by use of four photomasks 1a–1d, whereby a substantially an integral pattern of large size, corresponding to "one layer" of the liquid crystal panel display device, is printed on the whole surface of the base plate 3. And in order to achieve such "step-and-scan" exposure at a higher speed and with higher accuracy, the stage 4 is carried by the carriage 9.

The stage 4 is relatively heavy weighting of an order of, e.g. 40 kg. As for the carriage 9, on the other hand, lightness in weight is desired because it must scanningly move, during the exposure, both the base plate 3 and one of the masks 1a–1d in relation to the projection optical system 5. So, the carriage 9 is liable to be susceptible to deformation. Further, the carriage 9 is floatingly supported by the LAB 7. Also, the stage 4 itself is made light as compared with those used in conventional lens projection type exposure apparatuses, so as to allow the stage 4 to be carried by the carriage 9. As a result, the stage 4 is not very stiff. These features result in a high possibility of yawing of the stage 4 and thus θ-error between the mask and the base plate 3 due to deformation of the carriage 9, inclination of the carriage 9 by the application of uneven load to the LAB 7, deformation of components of the stage 4 or for any other reason, during movement of the stage 4 carrying the base plate 3, by the motor 4a or the like for the step-feeding of the base plate 3. In one aspect, the present invention aims at correcting such θ-error.

Referring now to FIG. 2, there is shown a control system of the exposure apparatus of the present embodiment. As shown in FIG. 2, the system includes a central processing unit (CPU) for controlling various operations of the exposure apparatus as a whole, a read-only-memory (ROM) 21 in which control programs for the CPU 20 are stored, a random access memory (RAM) 22 for temporarily storing various data which are to be produced when the CPU 20 carries out the control programs, a mask stage driving unit 23 for driving the mask stage 2, a base-plate stage driving unit 24 for driving the base-plate stage 4, and a keyboard 25. A laser interferometer unit 26 is provided, which includes two laser interferometers 26a and 26b each disposed in the X direction and a laser interferometer 26c disposed in the Y direction, such as shown in FIG. 4.

Figure 3:
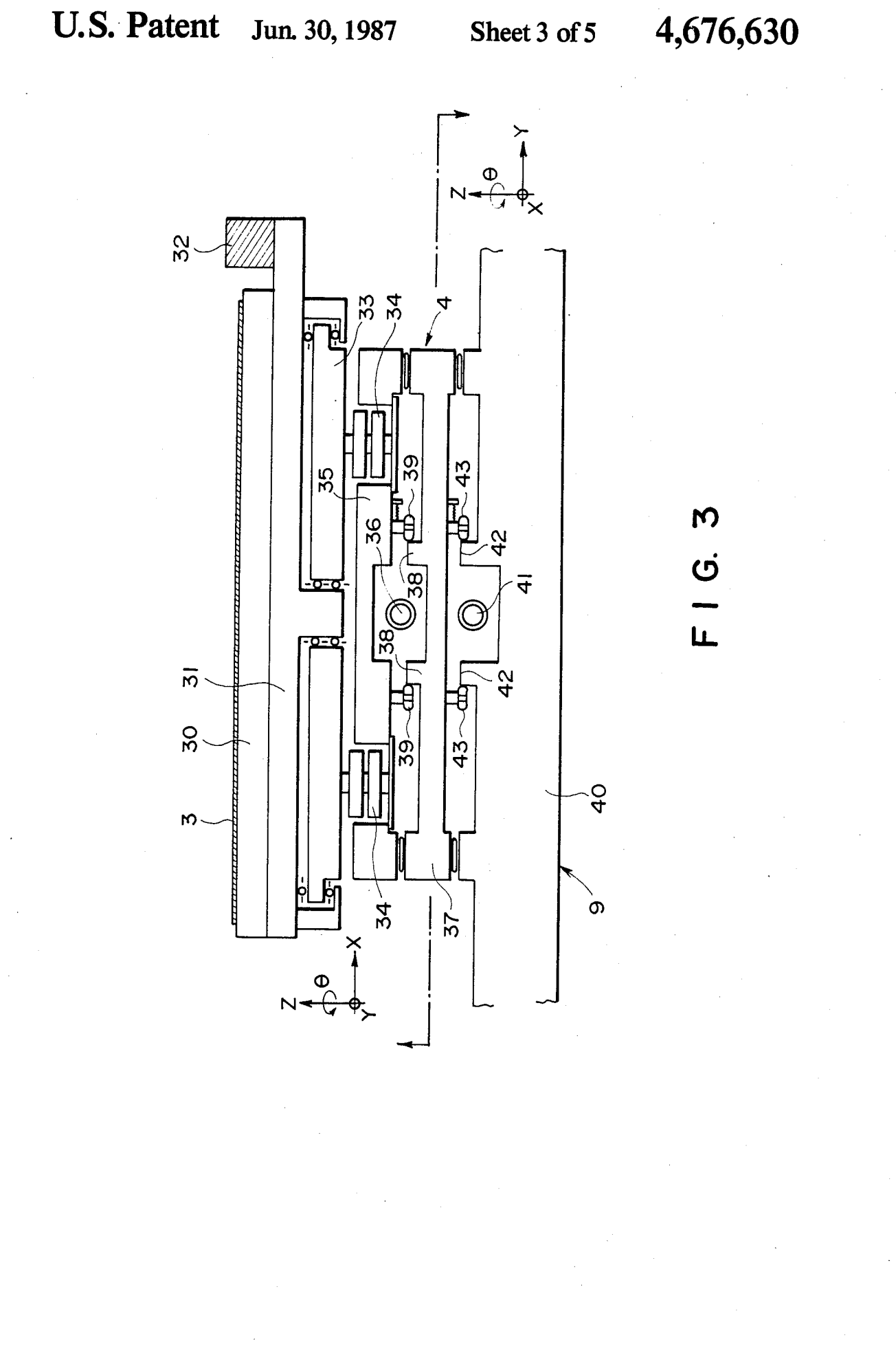

FIG. 3 is a sectional view showing details of the stage 4 of the exposure apparatus of the FIG. 1 embodiment. Denoted in FIG. 3 by numeral 30 is a chuck for holding the base plate 3 on the stage 4; by 31, a θ-table for rotating the base plate 3 in the plane containing the X and Y axes, together with the chuck 30; and by 32, an L-shaped mirror (hereinafter "square") for reflecting laser beams to the receivers 26a–26c of the laser interferometer unit 26. Denoted by numeral 33 is an X-Y table. The θ-table 31 is mounted on this X-Y table 33 for rotation with the aid of ball bearings. Actuators 34 - 34 are provided to move the base plate 3 in the Z direction, for the sake of focus adjustment and tilt adjustment. The actuators 34 - 34 comprise piezoelectric devices or diaphragms. Denoted by numeral 35 is a Y-slider which is slidably movable in the Y direction along Y-guides 38 - 38 formed on an X-slider 37, in accordance with rotation of a ball-screw 36 which is driven by an unshown motor. The X-Y table 33 is mounted to the Y-slider 35 by way of the actuators 34 - 34. Denoted by numerals 39 - 39 are sliding elements provided to assure movement of the Y-slider 35 following the Y-guides 38 - 38. The X-slider 37 is movable in the X direction along X-guides 42 - 42, formed on an upper surface of a base 40 for the carriage 9 and extending in the X direction, in accordance with rotation of a ball-screw 41 which is driven by an unshown motor. It is added that an upper half of FIG. 3 shows a section of the stage 4 as viewed in the Y direction while a lower half of FIG. 3 shows a section of the stage 4 as viewed in the X direction.

Figure 4:
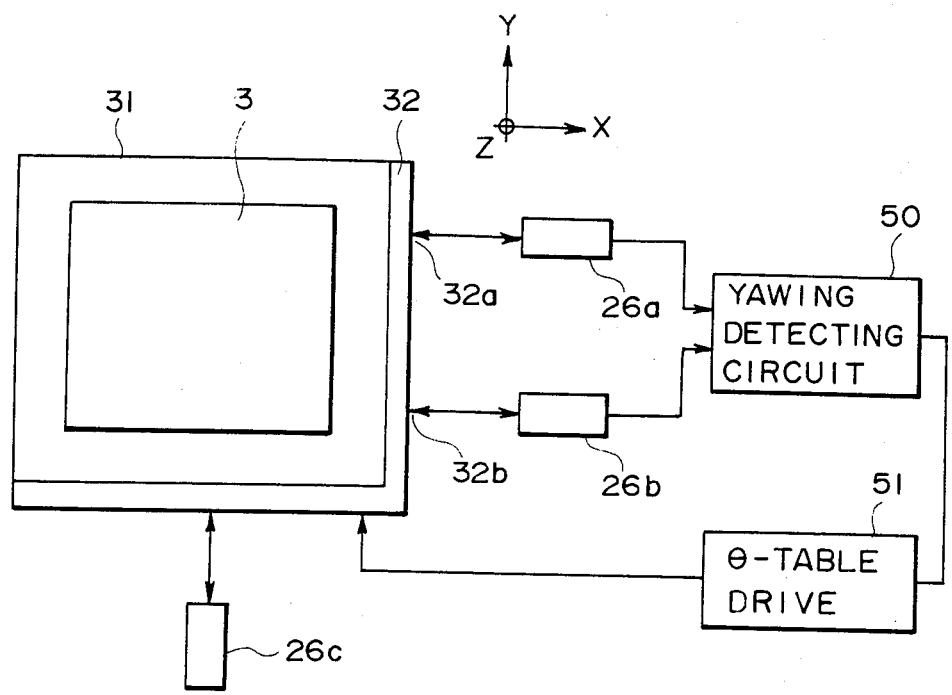
FIG. 4 is a schematic and diagrammatic view showing a yawing correcting system of the embodiment of FIG. 1.

Referring to FIG. 4, for description of the correction of yawing, it is seen that the exposure apparatus of the present embodiment is provided with a yawing detecting circuit 50. Laser interferometers 26a and 26b are adapted to read, at two points, the position of the stage 4 in the X direction, while laser interferometer 26c is adapted to read the position of the stage 4 in the Y direction. θ-table driving unit 51 is provided to drive the θ-table such as shown at 31 in FIG. 3.

When, in such arrangement, the base plate 3 is fed stepwise by the stage 4, the yawing detecting circuit 50 produces an output corresponding to an angle of yaw of the square 32 and thus the stage 4, on the basis of the results of measurement by the laser interferometers 26a and 26b, i.e. on the basis of the amounts of movements "X1" and "X2" of the points of detection 32a and 32b defined on the square 32 from respective reference positions. In other words, the yawing detecting circuit 50 produces an output corresponding to the angle of yaw $\theta$ which can be expressed as follows:

$$\theta = \tan^{-1}(X1 - X2)/L$$

wherein L is the distance between the points of measurement 32a and 32b by the laser interferometers 26a and 26b.

The output of the yawing detecting circuit 50 is supplied to the θ-table driving circuit 51, whereby, in accordance with the output of the yawing detecting circuit 50, the θ-table 31 is driven by such an amount and in a direction that removes the angle $\theta$, thus satisfying $\theta = 0$. In this manner, if yawing occurs during movement of the stage 4, the inclination of the stage 4 due to the yawing is detected by the yawing detecting circuit 50 at the time during the movement of the stage 4 or after completion of the movement of the stage 4. And, the θ-table 31 is rotationally moved by the θ-table driving circuit 51, whereby the inclination of the stage 4 due to the yawing is corrected automatically. If the correction of yawing causes any other deviation component, i.e. deviation in the X, Y or Z direction, appropriate one of the X-Y table 33 and the actuators 34 - 34 are driven by an unshown X-Y table driving circuit or an unshown tilt controlling circuit, such that the stage 4 is moved to adjust the position thereof in the X, Y or Z direction. By doing so, very accurate feeding of the stage 4 is attainable.

Where the square 32 for the laser beam measurement is mounted on the θ-table 31 as in the present embodiment and if there occurs a large angle of yawing such as of an order greater than 0.15 degree, for example, it is possible that the laser beam reflected by the square 32 does not come back to the laser interferometer. This will hereinafter be referred to as "laser error". In the present embodiment, however, such laser error is automatically prevented since, by the automatic correction of yawing described in the foregoing, the angle of deflection of the θ-table 31 is restricted within the range of, e.g., approx. 10 seconds (which is sufficiently within the tolerance for the positioning of the stage 4 in respect to the inclination). Of course, suitable means may be provided to restrict mechanically the angle of deflection of the θ-table 31 because it is effective to prevent the laser error particularly in an occasion where the servo control system for correcting the yawing is inoperative.

Figure 5:
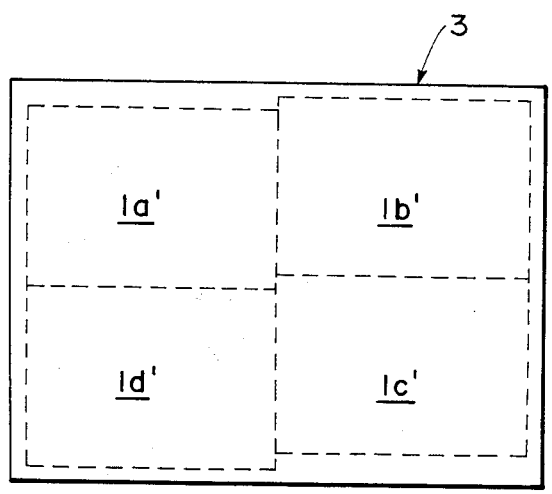
FIG. 5 is a plan view of a plate-like member, showing the state of pattern transfer when yawing occurs during movement of the plate-like member.
Figure 6:
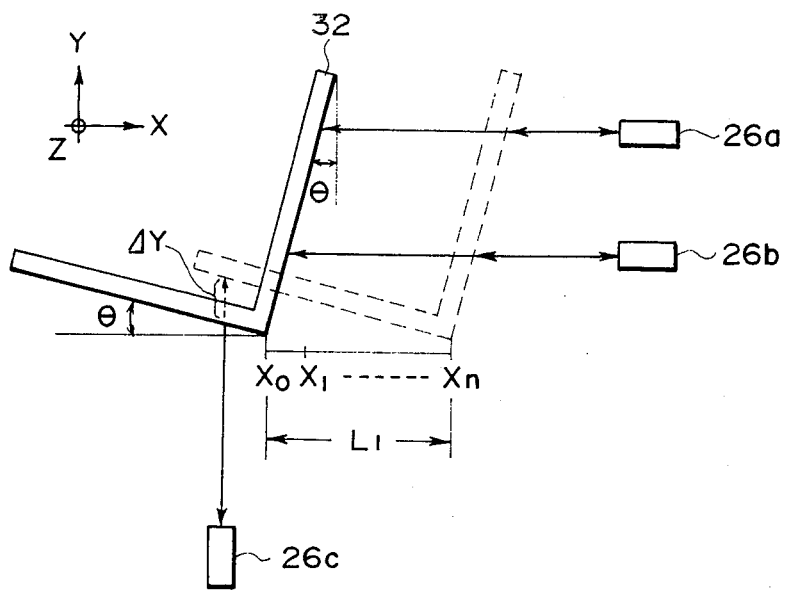
FIG. 6 is an explicatory view showing an initializing operation in the exposure apparatus of the FIG. 1 embodiment.
Figure 7:
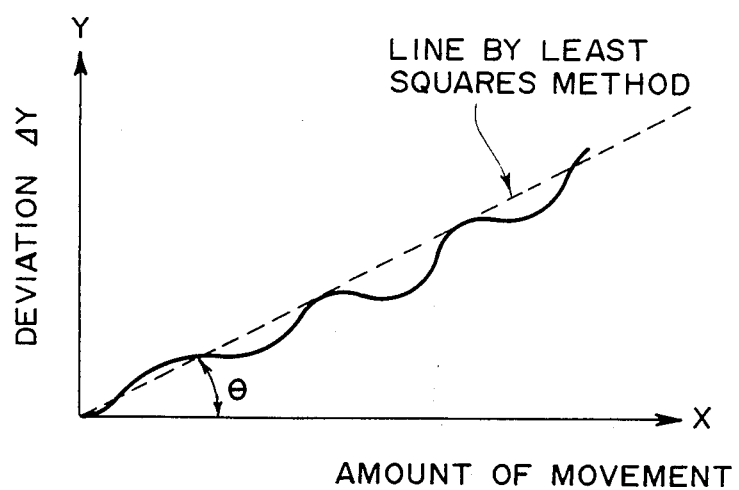
FIG. 7 is a graph showing an example of changes in deviation $\Delta Y$ upon the initializing operation.

In the exposure operation with the apparatus of FIG. 1 and particularly at the time of the exposure operation using a first mask (a mask having a pattern to be transferred onto the first layer on the base plate 3), it is possible that a shift or offset is caused between the patterns sequentially transferred onto the base plate 3, such as shown in FIG. 5. The occasion of occurrence of such shift or offset is that the laser interferometer is one which measures the distance from a certain reference position, and that usually the position of the square 32 at the time of start of the exposure apparatus is set as the reference position. Namely, if, such as shown in FIG. 6, the square 32 has in its initial state an inclination of an angle $\theta$ relative to the X-Y sliding axis of the stage 4 (X-Y table 34), and when the stage 4 is moved in the X direction by a distance L1 on the basis of the measurement by the laser interferometers 26a and 26b, the square 32 is displaced from a solid-line position to a broken-line position shown in this Figure. However, at this time, the value detected by the laser interferometer 26c changes by an amount $\Delta Y = L1 \cdot \tan \theta$. As a result, the base-plate stage driving circuit 24 is operated so as to move the stage 4 in the Y direction (positive or negative) to change the position of the stage 4 by an amount corresponding to the deviation $\Delta Y$. This results in the shift of offset of the patterns, such as shown in FIG. 5. The occurrence of such shift or offset of the patterns can be prevented in accordance with a further aspect of the present invention.

In the exposure apparatus of the present embodiment, the square position discriminating operation such as described below is carried out, as a part of an initializing operation at the time of start of the exposure apparatus or in response to the input of an instruction signal from the keyboard 25 instructing discrimination of the position of the square 32. The square position discriminating operation is made under the control of the CPU 20.

First, the square 32 is moved from a point X0 to a point Xn shown in FIG. 6 and, during such movement, deviations $\Delta Y1, \Delta Y2, \ldots, \Delta Yn$ of the square 32 in the Y direction at points X1, X2, ..., Xn, on the path of movement and as detected by the laser interferometer 26a or 26b, are calculated from the results of measurement by the laser interferometer 26c. Subsequently, the CPU 20 calculates the angle of inclination $\theta$ of the square 32 according to the least squares method. In other words, such a value of the angle $\theta$ that minimizes $\Sigma(Xk \cdot \tan \theta - \Delta Yk)^2$ is detected, and the thus detected value is adopted as the inclination of the square 32.

Calculating the angle of inclination $\theta$ by the least squares method is done because, if there occurs yawing of the stage 4, calculation of the inclination $\theta$ simply according to an equation $\theta = \tan^{-1}\Delta Yk/Xk$ would result in an enormouns variance in the results of measurement corresponding to respective points of measurement X1, X2, ..., Xn. If, on the other hand, the angle of inclination $\theta$ itself is so small that the variance is negligible, or where the precision of the moving mechanism of the stage 4 and the ridigity of the components of the stage 4 are so high that the yawing is very small, the inclination $\theta$ of the square 32 may of course be detected on the basis of the result of measurement only at one measuring point, e.g., in accordance with an equation $\theta = \tan^{-1}\Delta Yn/Xn$.

After detection of the inclination $\theta$ of the square 32 in the manner described above, the CPU 20 is operated to move the stage 4 to the "next-shot-area exposing position" by an amount including that corresponding to the correction of inclination $\theta$. For this correction, for example, the amounts of advancements Lx and Ly of the stage 4 in the X and Y directions, which are predetermined for the step-feeding, are changed by respective amounts $\Delta X = Ly \cdot \tan \theta$ and $\Delta Y = Lx \cdot \tan \theta$. It is a possible alterantive to rotate, before initiation of ordinary operations, the $\theta$-table 31 by an amount corresponding to the detected inclination $\theta$ of the square 32 so that the orientation of the square 32 is co-ordinated with the X-Y sliding axis.

While, in the foregoing, the present invention has been described with reference to an exposure apparatus of mirror projection type, the invention is applicable also to other types of exposure apparatuses, such as for example proximity type exposure apparatuses, contact type exposure apparatuses, lens projection type exposure apparatuses (called steppers) in which the pattern is transferred at a reduced scale. When, for example, the invention is applied to the stepper, the accuracy of step-feeding of the stage can be significantly improved particularly at the time of the exposure operation using a first mask. This is also the case with the exposure operation using a second mask, a third mask, etc. in an occasion that the step-feeding of the stage is made while relying on the precision of measurement by laser interferometers.

In accordance with the present invention, as has hitherto been described, a square for the laser beam measurement is mounted on a $\theta$-table operative to correct a positional error, in a rotational direction, of a plate-like member to be exposed. And, on the basis of the result of measurement by use of such square, any yawing of a stage, carrying the plate-like member and the $\theta$-table caused during movement of the stage is detected and corrected. With this arrangement, deviation $\theta$ of the plate-like member in the rotational direction due to the yawing of the stage at the time of step-feeding thereof is sufficiently suppressed, whereby higher accuracy is attainable in the step-feeding of the stage.

Also, suppression of $\theta$-deviation of the plate-like member upon completion of the step-feeding leads to reduction in time required for alignment thereof with respect to an original or mask, with the result that the throughput of the apparatus is improved.

Further, according to the present invention, any inclination of the square relative to the moving axis of the stage, which square is provided on the $\theta$-table for the sake of detecting the amount of movement of the stage, is detected at the time of start of the exposure apparatus and/or at any desired time. As a result, any component other than the moving component upon movement of the stage (e.g. the Y component in a case where the stage is moved in the X direction) can be discriminated and, therefore, any component other than the desired component can be corrected or cancelled. So, the moving accuracy of the stage can be improved significantly. Also, from this, it is possible to transfer plural patterns on the plate-like member in a satisfactorily contiguous fashion by sequential exposures thereby to "print" a substantially integral pattern of large size.

While the invention has been described with reference to the structures disclosed herein, it is not confined to the details set forth and this application is intended to cover such modifications or changes as many come within the purposes of the improvements or the scope of the following claims.

What is claimed is:

1. An apparatus for exposing, in sequence, different portions of a plate-like member to a pattern with radiation, said apparatus comprising:
    means for exposing, at one time, one of the different portions of the plate-like member to the pattern with radiation when said one portion is in a predetermined exposure region;
    means for moving the plate-like member, said moving means having a first stage movable rectilinearly and a second stage movable rotationally relative to said first stage; and
    means for controlling said moving means to cause it to place, in sequence, the different portions of the plate-like member in the predetermined exposure region, said controlling means having a reflecting member which is provided as a unit with said second stage and is usable to measure, by use of optical interference, a value related to the movement of said first stage.

2. An apparatus according to claim 1, further comprising means for supporting said moving means and means for displacing said supporting means during a time period during which said exposing means exposing said one portion of the plate-like member.

3. An apparatus for exposing, in sequence, different portions of a plate-like member to a pattern with radiation, said apparatus comprising:
    means for exposing, at one time, one of the different portion of the plate-like member to the pattern with radiation;
    means for moving the plate-like member so as to expose the different portions thereof, in sequence, by said exposing means, and moving means having a first stage movable rectilinearly and a second stage movable rotationally relative to said first stage;
    means having a reflecting member provided on said second stage, for measuring a value related to the movement of said first stage by use of said reflecting member;
    means for detecting any yawning of said first stage when said moving means moves the plate-like member, on the basis of the measurement by said measuring means; and
    means cooperative with said second stage, for correcting the yawing of said first stage in accordance with the detection by said detecting means.

4. An apparatus according to claim 3, wherein said measuring means includes a first optical interferometer system adapted to use light reflected at a first reflection point on said reflecting member and a second optical interferometer system adapted to use light reflected at a second reflection point on said reflecting member.

5. An apparatus according to claim 4, wherein said detecting means detects the yawing of said first stage on the basis of an interval between the first and second reflection points on said reflecting member and of any difference between values obtained as a result of measurements made by said first and second optical interferometer systems.

6. An apparatus for exposing, in sequence, different portions of a plate-like member to a pattern with radiation, said apparatus comprising:
    means for exposing, at one time, one of the different portions of the plate-like member;
    means for moving the plate-like member so that the different portions thereof are exposed in sequence by said exposing means, said moving means having a first stage movable rectilinearly and a second stage movable rotationally relative to said first stage;

means having a reflecting member provided on said second stage, for measuring a value related to the movement of said first stage by use of said reflecting member;

means operable, when said first stage moves in a rectlinear direction, to detect any inclination of said reflecting member with respect to the moving direction of said first stage, on the basis of a value obtained by the measurement made by said measuring means in relation to the movement of said first stage; and means cooperable with said second stage, for correcting the inclination of said reflecting member in accordance with the detection by said inclination detecting means.

7. An apparatus according to claim 6, wherein said inclination detecting means detects the inclination from the measured value in accordance with the least squares method.

8. An apparatus for exposing, in sequence, different portions of a plate-like member to a pattern with radiation, said apparatus comprising:

means for exposing, at one time, one of the different portions of the plate-like member to the pattern with radiation;

means for moving the plate-like member so that the different portions of the plate-like member are exposed in sequence by said exposing means, said moving means having a first stage movable rectilinearly and a second stage movable rotationally relative to said first stage; and means having a reflecting member provided on said second stage and an optical interferometer system cooperative with said reflecting member, for detecting any yawing of said first stage when said moving means moves the plate-like member.

9. An apparatus, comprising:

means for moving a movable member, said moving means having a first stage movable rectilinearly in a first direction, a second stage movable rectilinearly in a second direction different from the first direction, and a third stage movable rotationally in a plane substantially parallel to a plane in which the first and second directions are contained; and means operable on said moving means, for controlling the movement of the movable member, said controlling means having a first optical interferometer system, with a first reflecting member provided on said third stage, adapted to measure a value related to the movement of said first stage in the first direction in cooperation with said first reflection member, and a second optical interferometer system, with a second reflecting member provided on third stage, adapted to measure a value related to the movement of said second stage in the second direction in cooperation with said second reflecting member.

10. An apparatus according to claim 9, wherein said first and second reflecting members are formed as a unit.

* * * * *

UNITED STATES PATENT AND TRADEMARK OFFICE
CERTIFICATE OF CORRECTION

PATENT NO. : 4,676,630

DATED : June 30, 1987

INVENTOR(S) : KOICHI MATSUSHITA, ET AL.

It is certified that error appears in the above-identified patent and that said Letters Patent is hereby corrected as shown below:

COLUMN 1

Line 35,   "not" should be deleted.

COLUMN 3

Line 18,   "range to to light" should read --range to illuminate one of the masks held at the predetermined exposure station by the mask stage 2. By exposing a photosensitive layer formed on the glass base plate 3 to light--.

COLUMN 8

Line 29,   "portion" should read --portions--.
    Line 41,   "yawning" should read --yawing--.

COLUMN 9

Line 9,   "rectlinear" should read --rectilinear--.

UNITED STATES PATENT AND TRADEMARK OFFICE
CERTIFICATE OF CORRECTION

PATENT NO. : 4,676,630                  Page 2 of 2

DATED : June 30, 1987

INVENTOR(S) : KOICHI MATSUSHITA, ET AL.

It is certified that error appears in the above-identified patent and that said Letters Patent is hereby corrected as shown below:

COLUMN 10

Line 25, "third" should read --said third--.

Signed and Sealed this

Twenty-ninth Day of September, 1987

Attest:

DONALD J. QUIGG

Attesting Officer        Commissioner of Patents and Trademarks